United States Patent
Wu

(10) Patent No.: US 10,978,148 B1
(45) Date of Patent: Apr. 13, 2021

(54) HYBRID SENSING SCHEME COMPENSATING FOR CELL RESISTANCE INSTABILITY

(71) Applicant: Taiwan Semiconductor Manufacturing Company Limited, Hsinchu (TW)

(72) Inventor: Jau-Yi Wu, Zhubei (TW)

(73) Assignee: TAIWAN SEMICONDUCTOR MANUFACTURING COMPANY LIMITED, Hsinchu (TW)

( * ) Notice: Subject to any disclaimer, the term of this patent is extended or adjusted under 35 U.S.C. 154(b) by 0 days.

(21) Appl. No.: 16/784,512

(22) Filed: Feb. 7, 2020

(51) Int. Cl.
*G11C 13/00* (2006.01)
*G11C 11/56* (2006.01)

(52) U.S. Cl.
CPC ........ *G11C 13/004* (2013.01); *G11C 11/5678* (2013.01); *G11C 13/0004* (2013.01); *G11C 2013/0045* (2013.01); *G11C 2013/0057* (2013.01)

(58) Field of Classification Search
CPC .............. G11C 13/004; G11C 13/0004; G11C 11/5678; G11C 2013/0057; G11C 2013/0045
See application file for complete search history.

(56) References Cited

U.S. PATENT DOCUMENTS

| | | | | |
|---|---|---|---|---|
| 6,281,713 B1* | 8/2001 | Kim | ....................... | G11C 7/062 327/55 |
| 9,349,466 B2* | 5/2016 | Kim | ................... | G11C 16/0483 |
| 9,672,879 B1* | 6/2017 | Lee | ......................... | G11C 16/26 |
| 2005/0180224 A1* | 8/2005 | Tzartzanis | ............ | G11C 7/062 365/189.09 |
| 2008/0025072 A1* | 1/2008 | Tamai | ................ | G11C 13/0069 365/148 |
| 2009/0010086 A1* | 1/2009 | Hong | ..................... | G11C 7/065 365/207 |
| 2009/0027948 A1* | 1/2009 | Ruehrig | .............. | G11C 11/1675 365/158 |
| 2013/0039117 A1* | 2/2013 | Lin | ......................... | G11C 17/18 365/96 |
| 2014/0139246 A1* | 5/2014 | Chuang | .............. | G01R 31/2874 324/750.06 |
| 2014/0211541 A1* | 7/2014 | Sebastian | ........... | G11C 13/0061 365/148 |
| 2019/0080757 A1* | 3/2019 | Shimizu | ............. | G11C 13/0064 |
| 2020/0105341 A1* | 4/2020 | Wu | ..................... | G11C 13/0064 |

* cited by examiner

*Primary Examiner* — Khamdan N. Alrobaie
(74) *Attorney, Agent, or Firm* — The Marbury Law Group, PLLC

(57) ABSTRACT

Various embodiments provide a hybrid sensing scheme that may compensate for cell resistance instability in semiconductor devices, such as multi-level cell (MLC) type phase-change random-access memory (PCRAM) structures. Various embodiments may achieve a stable resistance state supporting MLC applications in PCRAM cells.

20 Claims, 11 Drawing Sheets

HYBRID SENSING SCHEME COMPENSATING FOR CELL RESISTANCE INSTABILITY

BACKGROUND

The present disclosure is directed to semiconductor devices and sensing schemes for the same, specifically including hybrid sensing schemes including current sensing and voltage sensing supporting multi-level cell (MLC) type phase-change random-access memory (PCRAM) structures.

A phase-change random-access memory (PCM or PCRAM) is a form of non-volatile random-access computer memory. PCRAM technology is based upon a material that can be either amorphous or crystalline at normal ambient temperatures. When the material is in the amorphous state, the material has a high electrical resistance. When the material is in the crystalline state, the material has a low electrical resistance. In order to control the state of the material, the material may be heated and cooled. By heating the material above its crystallization point, the material enters is crystalline state. The material may be heated, for example, by passing current through a heating element. As the material cools, it enters an amorphous state. Based on the structural relaxation in the amorphous state, the cell electrical resistance increases over time for the PCRAM cell.

PCRAMs also have the ability to achieve a number of distinct intermediary states, thereby having the ability to hold multiple bits in a single cell, such as two bits supporting an MLC type memory structure. However, resistance for the PCRAM cells drifts up and current drifts down because of the structural relaxation in the amorphous state. Thus, it can be a challenge to store data in PCRAM cells operating as MLCs due to the sensing window for the PCRAM cells degrading over time. Conventional single sensing methods, such as conventional current sensing methods using a fixed read voltage (Vread) or conventional voltage sensing methods using a fixed read current (Iread) have not been sufficient to solve the resistance and current drift issues.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
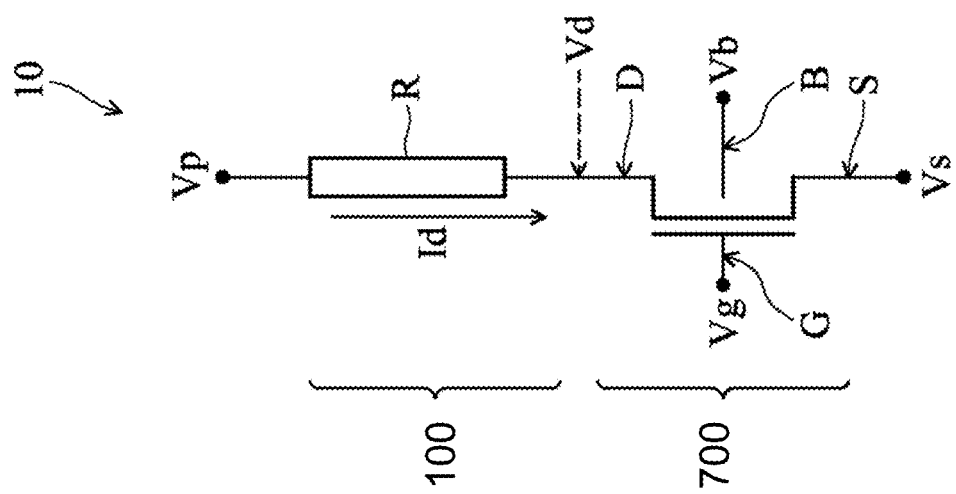
FIG. 1 is a schematic view of a phase-change random-access memory (PCRAM) structure including a phase-change memory cell and a field effect transistor, according to various embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Ranges can be expressed herein as from "about" one particular value, and/or to "about" another particular value. When such a range is expressed, examples include from the one particular value and/or to the other particular value. Similarly, when values are expressed as approximations, by use of the antecedent "about" or "substantially" it will be understood that the particular value forms another aspect. In some embodiments, a value of "about X" may include values of +/−1% X. It will be further understood that the endpoints of each of the ranges are significant both in relation to the other endpoint, and independently of the other endpoint.

A phase-change random-access memory (PCRAM) is a non-volatile memory device that makes use of different resistive phases and heat induced phase transition between the phases of phase-change materials including chalcogenide and resistive materials. A PCRAM may be composed of many memory cells that operate independently. A PCRAM cell may include a heater and a resistor. The PCRAM cell may operate as a data storage element made mainly of a reversible phase-change material to provide at least two dramatically different resistivities for logical "0" state and "1" state. To read a state (data) from the PCRAM cell, a sufficiently small current is applied to the phase-change material without triggering the heater to generate heat. In this way, the resistivity of the phase-change material may be measured and the states representing the resistivities, i.e. a "0" state for high resistivity or a "1" state for low resistivity can be read.

To write a state (data) in the PCRAM cell, for example, to write a "1" state representing a low resistivity phase of the phase-change material, a medium electric current may be applied to the heater which generates heat for annealing the phase-change material at a temperature above the crystallization temperature but below the melting temperature of the phase-change material for a time period to achieve a crystalline phase. As the phase-change material heats to a temperature above the crystallization temperature, the material may enter a crystalline state where the phase-change material exhibits a low electrical resistance. With the low resistance value, a charge may flow into the material to establish the "1" state value.

To write a "0" state representing a high resistivity phase of the phase-change material, a very large electric current may be applied to the heater to generate heat to melt the phase-change material at a temperature higher than the melting temperature of the phase-change material; and the electric current is abruptly cut off to lower the temperature to below the crystallization temperature of the phase-change material to quench and stabilize the amorphous structure of phase-change material. As the phase change material enters the amorphous state, the phase-change material exhibits a high resistance value. The high resistance value may impede a charge from flowing into the material to establish a "0" state value. The very large electric current can thus be in a pulse form.

FIG. 1 is a schematic view of a PCRAM structure 10 constructed according to an embodiment. The PCRAM structure 10 may include one phase-change memory cell 100 and a current-controlling device 700 connected together. The phase-change memory cell 100 includes a phase-change material layer interposed between two electrodes. In one embodiment, the resistance of the phase-change layer material is configured to be adjusted into multiple levels that represent different logic states, respectively.

The current-controlling device 700 in the PCRAM structure 10 may be a device that is operable to control the current flow through the phase-change memory cell 100 during the operations. In the present embodiment, the current-controlling device 700 is a transistor (or selector transistor), such as a field effect transistor (FET). For example, the FET 700 may be a metal-oxide-semiconductor (MOS) FET. The FET 700 includes source (S), drain (D) and gate (G). The source S and drain D may be designed asymmetrically, such that a voltage drop over the FET during a forming operation and an off-state leakage current may be collectively optimized. The source S and drain D may separately formed, so that the source S and drain D may be independently tuned to achieve the asymmetric structure. More particularly, the source S and drain D may be different from each other in term of doping concentration. In various embodiments, the source and drain may be different in at least one of doping concentration, doping profile and doping species.

The FET 700 may be electrically coupled with the memory cell 100. In the present example, one electrode of the memory cell 100 is connected to the drain D of the FET 700. The gate G of the FET 700 may be connected to a word line, and another electrode of the memory cell 100 may be connected to a bit line, as discussed in detail with regard to FIG. 3.

As illustrated in FIG. 1, the gate (G), source (S), drain (D) and body of the FET 700 are labeled as G, S, D, and B, respectively. The corresponding voltages of the gate, source, drain and substrate during the operations are labeled as Vg, Vs, Vd and Vb, respectively. Furthermore, during operation, the current through the memory cell 100 is labeled as Id, and the voltage applied to one electrode of memory cell 100 from the bit line is labeled as Vp.

In one embodiment, the PCRAM structure 10 may be a two terminal memory structure, with the gate of the FET 700 operating as a first terminal, and one electrode of the memory cell 100 operating as a second terminal. The first terminal is controlled by a first voltage applied to the gate G of FET 700 from the word line, and the second terminal is controlled by a second voltage applied to the one electrode of the phase-change memory cell from the bit line. In one example, the source is grounded, and the body of the FET 700 is grounded or floating.

In another embodiment, the PCRAM structure 10 may be a three terminal memory structure, wherein the three terminals include the gate of FET 700 as a first terminal, the electrode of the memory cell 100 (the electrode that is not directly connected with the drain of the transistor) as a second terminal, and the source of the FET 700 as a third terminal. Particularly, during the operations of the phase-change memory cell 100, the first terminal (gate) may be controlled by a first voltage from the word line, the second terminal may be controlled by a second voltage from the bit line, and the third terminal may be controlled by a third voltage from a source line. In one example, the source is grounded. In an alternative example, the second terminal is grounded. The substrate (or the body) of the FET 700 may be grounded or floating.

Figure 2:
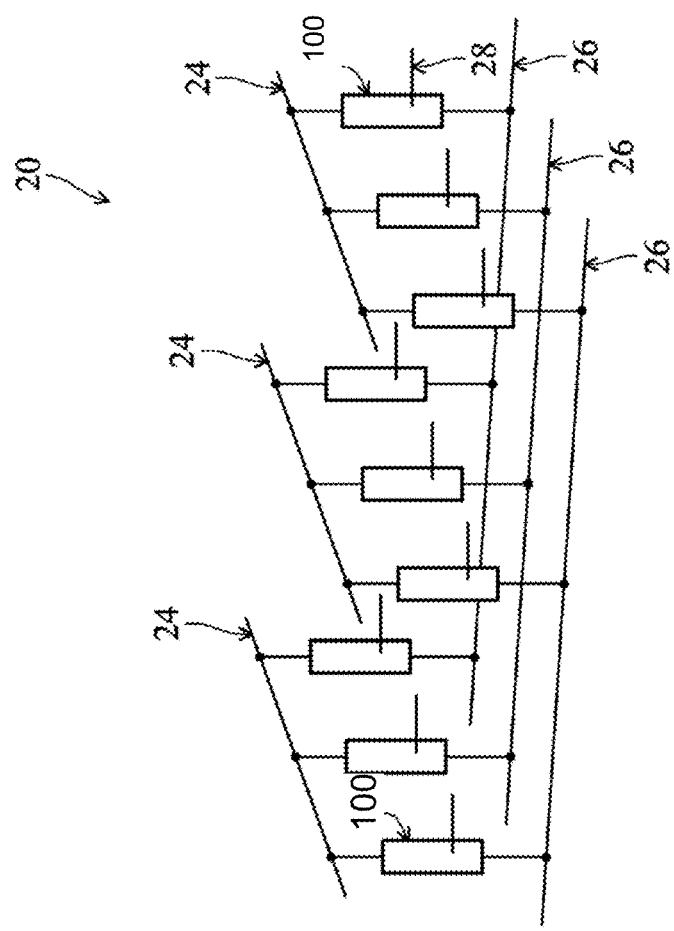
FIG. 2 is a schematic view of a PCRAM structure including multiple phase-change memory cells, according to various embodiments of the present disclosure.

FIG. 2 is a schematic view of a memory structure 20 having a plurality of phase-change memory cells 100 constructed according various embodiments of the present disclosure. With reference to FIGS. 1-2, the phase-change memory cells 100 may be configured in an array coupled with a plurality of word lines 24 and a plurality of bit lines 26. In one embodiment, the word lines 24 and the bit lines 26 may be cross-configured. Furthermore, each of the phase-change memory cells 100 may be operable to achieve multiple resistance levels and accordingly multiple bit storage. In the present embodiment, source lines 28 are configured to connect to the sources of the memory cells 100, respectively. The source lines 28 may be configured such that one source line 28 is coupled with one respective phase-change memory cell 100. Alternatively, one source line may be coupled with a subset of the phase-change memory cells 100 in the memory structure 20.

Figure 3:
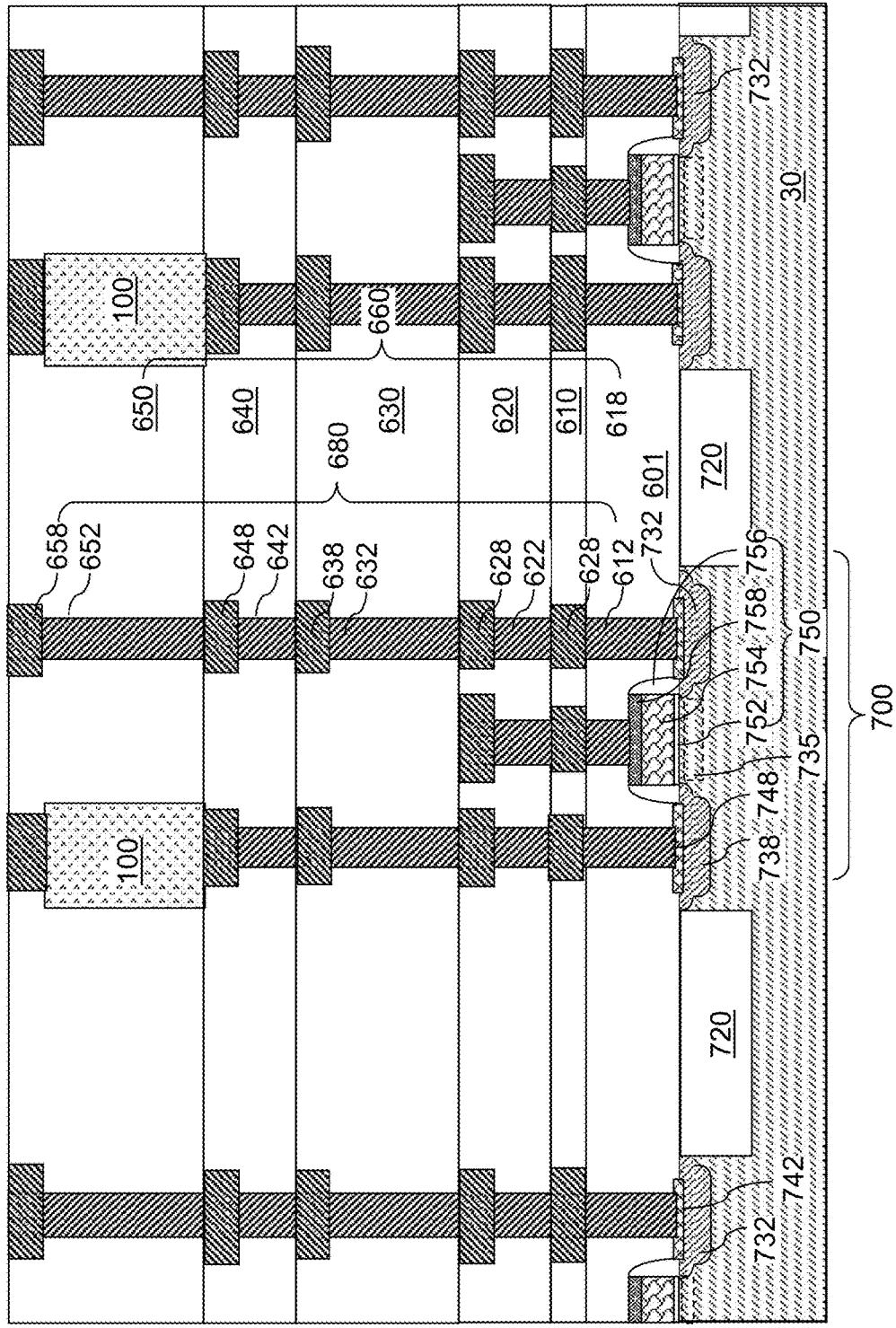
FIG. 3 is a vertical sectional view of a memory device including a phase-change memory cell and a FET, according to various embodiments of the present disclosure.

FIG. 3 is a cross sectional view of a memory device 200, according to various embodiments of the present disclosure. With reference to FIGS. 1-3, the memory device 200 includes one or more phase-change memory cells 100 and corresponding field effect transistors (FETs) 700, disposed on a substrate 30. The memory device 200 can include a two-dimensional array of memory cells arranged in a 1T1R configuration, i.e., a configuration in which one access transistor is connected to one resistive memory cell.

The substrate 30 can be a semiconductor substrate such as a commercially available silicon substrate. Alternatively, or additionally, the substrate 30 may include elementary semiconductor materials, compound semiconductor materials, and/or alloy semiconductor materials. Examples of the elementary semiconductor materials may be, but are not limited to, crystal silicon, polycrystalline silicon, amorphous silicon, germanium, and/or diamond. Examples of the compound semiconductor materials may be, but are not limited to, silicon carbide, gallium arsenic, gallium phosphide, indium phosphide, indium arsenide, and/or indium antimonide. Examples of the alloy semiconductor materials may be, but are not limited to, SiGe, GaAsP, AlInAs, AlGaAs, GaInAs, GaInP, and/or GaInAsP. Other suitable materials within the contemplated scope of disclosure may also be used.

The FETs 700 may provide functions that are needed to operate the memory cells 100. Specifically, the FETs 700 can be configured to control the programming operation, the erase operation, and the sensing (read) operation of the memory cells 100. In some embodiments, the memory device 200 may include sensing circuitry and/or a top electrode bias circuitry on the substrate 30. The FETs 700 may include complementary metal-oxide-semiconductor (CMOS) transistors. The substrate 30 may optionally include additional semiconductor devices (such as resistors, diodes, capacitors, etc.).

Shallow trench isolation structures 720 including a dielectric material such as silicon oxide can be formed in an upper portion of the substrate 30. Suitable doped semiconductor wells, such as p-type wells and n-type wells can be formed within each area that is laterally enclosed by a continuous portion of the shallow trench isolation structures 720. Accordingly, the FETs 700 may be formed on the substrate 30 between the isolation structures 720, such that the FETs 700 may be electrically isolated from one another by the isolation structures 720.

Each FET 700 may include a source region 732, a drain region 738, a semiconductor channel 735 that includes a surface portion of the substrate 30 extending between the source region 732 and the drain region 738, and a gate structure 750. Each gate structure 750 can include a gate dielectric 752, a gate electrode 754, a gate cap dielectric 758, and a dielectric gate spacer 756. A source-side metal-semiconductor alloy region 742 can be formed on each source region 732, and a drain-side metal-semiconductor alloy region 748 can be formed on each drain region 738.

In some embodiments, the channel region 735 may be doped with a first type dopant, and the source region 732 and the drain region 738 may be doped with a second type dopant, opposite to the first type. In the present example, the FET 700 may be an n-type FET (nFET). Accordingly, the channel region 735 may be p-type channel.

In one embodiment, the source region 732 may be formed by a first ion implantation process, and the drain region 738 may be formed by a second ion implantation process. The second ion implantation process may be different from the first ion implantation process in at least one of doping dose, implanting angle and dopant (doping species). In one embodiment, the first ion implantation process includes forming a first patterned mask on the substrate, and applying the first ion implantation to the substrate using the first patterned mask as an implantation mask. The first patterned mask may include an opening such that a substrate region for the source is uncovered thereby. The first patterned mask may be a patterned photoresist layer formed by a lithography process, or alternatively, a patterned hard mask formed by lithography process and etching. Similarly, the second ion implantation process may include forming a second patterned mask on the substrate, and applying the second ion implantation to the substrate using the second patterned mask as an implantation mask. The second patterned mask may include an opening such that a substrate region for the drain is uncovered thereby. The second patterned mask may be similar to the first patterned mask in terms of formation and composition.

Various metal interconnect structures 680 formed in dielectric material layers 660 may be formed over the substrate 30 and the devices formed thereon (such as the FETs 700). The dielectric material layers can include, for example, a contact-level dielectric material layer 601, a first metal-line-level dielectric material layer 610, a second line-and-via-level dielectric material layer 620, a third line-and-via-level dielectric material layer 630, a fourth line-and-via-level dielectric material layer 640, and a fifth line-and-via-level dielectric material layer 650.

The metal interconnect structures 680 may be formed by performing any suitable deposition process, such as a chemical vapor deposition (CVD) process, a physical vapor deposition (PVD) process, an atomic layer deposition (ALD) process, a high density plasma CVD (HDPCVD) process, a metal organic CVD (MOCVD) process, an electroplating process, or a plasma enhanced CVD (PECVD) process.

The metal interconnect structures may include device contact via structures 612 formed in the contact-level dielectric material layer 601 and that contact respective component of the FETs 700, first metal lines 618 formed in the first metal-line-level dielectric material layer 610, first metal via structures 622 formed in a lower portion of the second line-and-via-level dielectric material layer 620, second metal lines 628 formed in an upper portion of the second line-and-via-level dielectric material layer 620, second metal via structures 632 formed in a lower portion of the third line-and-via-level dielectric material layer 630, third metal lines 638 formed in an upper portion of the third line-and-via-level dielectric material layer 630, third metal via structures 642 formed in a lower portion of the fourth line-and-via-level dielectric material layer 640, fourth metal lines 648 formed in an upper portion of the fourth line-and-via-level dielectric material layer 640, fourth metal via structures 652 formed in a lower portion of the fifth line-and-via-level dielectric material layer 650, and fifth metal lines 658 formed in an upper portion of the fifth line-and-via-level dielectric material layer 650. In one embodiment, the metal interconnect structures 680 can include source line that are connected a source-side power supply for an array of memory elements. The voltage provided by the source lines can be applied to the bottom electrodes through the access transistors provided in the memory array region 100.

Each of the dielectric material layers (601, 610, 620, 630, 640, 650) may include a dielectric material such as undoped silicate glass, a doped silicate glass, organosilicate glass, amorphous fluorinated carbon, porous variants thereof, or combinations thereof. Each of the metal interconnect structures (612, 618, 622, 628, 632, 638, 642, 648, 658) may include at least one conductive material, which can be a combination of a metallic liner layer (such as a metallic nitride or a metallic carbide) and a metallic fill material. Each metallic liner layer can include TiN, TaN, WN, TiC, TaC, and WC, and each metallic fill material portion can include W, Cu, Al, Co, Ru, Mo, Ta, Ti, alloys thereof, and/or combinations thereof. Other suitable materials within the contemplated scope of disclosure may also be used. In one embodiment, the first metal via structures 612 and the first metal line 618 may be formed as integrated line and via structures by a dual damascene process, the second metal via structure 622 and the second metal lines 628 may be formed as integrated line and via structures by a dual damascene process, the third metal via structures 632 and the third metal lines 638 may be formed as integrated line and via structures by a dual damascene process, the fourth metal via structures 642 and the fourth metal lines 648 may be formed as integrated line and via structures by a dual damascene process, and/or the fifth metal via structures 652 and the fourth metal lines 648 may be formed as integrated line and via structures by a dual damascene process.

In some embodiments, the memory cells 100 may be disposed within the fifth dielectric material layer 650, and each memory cell 100 may be electrically connected to a respective fourth metal line 648 and a fifth metal line 658. However, the present disclosure is not limited to any particular location for the memory cells 100. For example, the memory cells 100 may be disposed within any of the dielectric material layers 660.

The metal interconnect structures 680 may be configured to connect each memory cell 100 to a corresponding FET 700, and to connect the FET 700 to corresponding signal lines. For example, the drain region 738 of the FET 700 may be electrically connected to a bottom electrode of the memory cell 100 via, for example, a subset of the metallic via structures (612, 622, 632, 642) and a subset of the metal lines (618, 628, 638, 648). Each drain region 738 may be connected to a first node (such as a bottom node) of a respective memory cell 100 via a respective subset of the metal interconnect structures 680. The gate electrode 754 of each FET 700 may be electrically connected to a word line, which can be embodied as a subset of the metal interconnect structures 680. A top electrode of each memory cell 100 may be electrically connected to a respective bit line, which is embodied as a respective subset of the metal interconnect structures. Each source region 732 may be electrically connected to a respective source line, which is embodied as a respective subset of the metal interconnect structures. While only five levels of metal lines are illustrated in FIG. 3, it is understood that more metal line levels can be formed above the illustrated levels of FIG. 3. Further, it is understood that the levels in which the source lines, word lines, and bit lines are formed may be selected based on design parameters.

Due to structural relaxation in the amorphous state of a PCRAM cell, cell resistance increases over time. The increase in the cell resistance causes the sensed voltage measurement ($V_{cell}$) when a selected read current ($I_{read}$) is applied to the PCRAM cell to increase over time. The increase in the cell resistance also causes the sensed current measurement ($I_{cell}$) when a selected read voltage ($V_{read}$) is applied to the PCRAM cell to decrease over time. Thus, using only the Vcell or the Icell alone makes it difficult to determine a precise resistance state of the PCRAM cell because the resistance drift causes the Vcell and Icell to drift.

This drifting $V_{cell}$ and $I_{cell}$ measurements degrade the sensing window associated with a resistance state of the PCRAM cell in conventional systems. For example, a sensed $V_{cell}$ drifting up over time when a selected Iread is applied may cause the $V_{cell}$ overtime to drift out of (e.g., above) an expected $V_{cell}$ measurement correlated with a PCRAM cell resistance state. Thus, as the sensing window for Vcell degrades (e.g., climbs outside the expected values over time due to PCRAM cell resistance increasing), conventional memory circuits are unable to precisely associate the sensed Vcell with an expected resistance state and thereby fail to precisely determine the resistance state of the PCRAM cell. This lack of precision in associating sensed $V_{cell}$ with a resistance state of the PCRAM cell in conventional memory circuits is a challenge for supporting MLC data storage in PCRAM cells as the resistance state of the PCRAM cell cannot be determined precisely overtime by applying only a selected $I_{read}$.

As a similar example, a sensed $I_{cell}$ drifting down over time when a selected $V_{read}$ is applied may cause the $I_{cell}$ overtime to drift out of (e.g., below) an expected $I_{cell}$ measurement correlated with a PCRAM cell resistance state. Thus, as the sensing window for $I_{cell}$ degrades (e.g., falls below the expected values over time due to PCRAM cell resistance increasing), conventional memory circuits are unable to precisely associate the sensed $I_{cell}$ with an expected resistance state and thereby fail to precisely determine the resistance state of the PCRAM cell. This lack of precision in associating sensed Icell with a resistance state of the PCRAM cell in conventional memory circuits is a challenge for supporting MLC data storage in PCRAM cells as the resistance state of the PCRAM cell cannot be determined precisely overtime by applying only a selected $V_{read}$.

Various embodiments disclosed herein provided methods for sensing a resistance state of a PCRAM cell that compensates for resistance drift in the PCRAM cell. Various embodiments may provide a hybrid sensing scheme that may compensate for cell resistance instability PCRAM structures. Various embodiments may achieve a stable sensing window over time that may enable resistance state determinations for PCRAM structures that may enable MLC applications in PCRAM cells.

Various embodiments may provide a hybrid sensing scheme combining current sensing ($I_{cell}$) under a fixed read current ($I_{read}$) and voltage sensing ($V_{cell}$) under a fixed read voltage ($V_{read}$). Various embodiments may balance the sensing results for current sensing ($I_{cell}$) and voltage sensing ($V_{cell}$) together to generate a hybrid sensing state of the PCRAM cell (e.g., a hybrid sensing ($H_{cell}$)). In various embodiments, the use of a hybrid sensing state (e.g., $H_{cell}$) may reduce (e.g., minimize) the impact of resistance drift on the sensed measurement in comparison to the impact of resistance drift on voltage sensing ($V_{cell}$) or current sensing ($I_{cell}$) alone. In various embodiments, the hybrid sensing state (e.g., $H_{cell}$) may be correlated (e.g., in a look-up table, etc.) with resistance state indications for a PCRAM cell. In various embodiments, as the hybrid sensing state (e.g., $H_{cell}$) may not substantially vary (e.g., may be approximately constant) over time (e.g., the hybrid sensing state (e.g., $H_{cell}$) may vary less than 0.1E-6 over a period of 1000 seconds, such as vary less than 0.6E-7 over a period of 1000 seconds, vary 0.5E-7 over a period of 1000 seconds, etc.), the hybrid sensing state (e.g., $H_{cell}$) may be about constant despite PCRAM cell resistance drift. In various embodiments, the hybrid sensing state (e.g., $H_{cell}$) correlated (e.g., in a look-up table, etc.) with resistance state indications for a PCRAM cell may enable the determined hybrid sensing state (e.g., $H_{cell}$) to be used to determine the actual resistance state of the PCRAM cell at any time regardless as to the amount of resistance drift that may have occurred in the PCRAM cell. As the hybrid sensing state (e.g., $H_{cell}$) may not substantially vary (e.g., may be approximately constant) over time (e.g., the hybrid sensing state (e.g., $H_{cell}$) may vary less than 0.1E-6 over a period of 1000 seconds, such as vary less than 0.6E-7 over a period of 1000 seconds, vary 0.5E-7 over a period of 1000 seconds, etc.), the hybrid sensing state (e.g., $H_{cell}$) may be a stable sensing window over time that may enable MLC applications in PCRAM cells.

Figure 4:
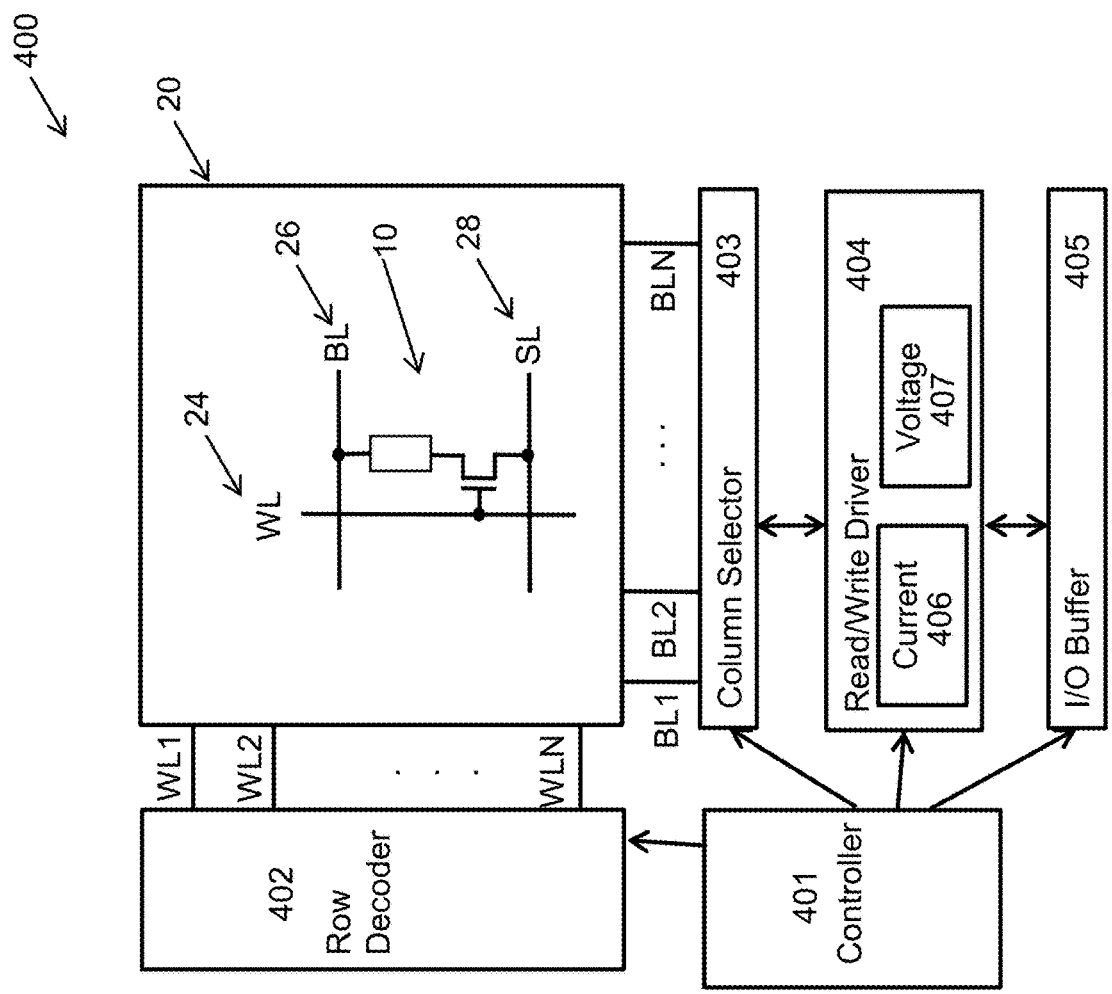
FIG. 4 is a block diagram of a memory circuit, according to various embodiments of the present disclosure.

FIG. 4 is a block diagram of a memory circuit 400, according to various embodiments of the present disclosure. With reference to FIGS. 1-4, the memory circuit 400 may be configured to implement various embodiment methods for providing a hybrid sensing scheme that may compensate for cell resistance instability. The memory circuit 400 may be configured to sense a resistance state of a cell of a PCRAM structure that is part of a memory structure, such as a PCRAM cell 100 of a PCRAM structure 10 that is part of a memory structure 20 having a plurality of PCRAM cells 100, that compensates for resistance drift in one or more of the PCRAM cells 100. For example, the memory circuit 400 may be configured to implement operations of method 800 described below with reference to FIG. 8. Only a single structure 10 is illustrated in FIG. 4 for ease of illustration, but additional structures 10 may be included in the memory structure 20 as discussed above.

The memory circuit 400 may include a controller 401, a row decoder 402, a column selector 403, a read/write driver 404, and one or more input/output (I/O) buffers 405. In various embodiments, the controller 401 may be coupled to the row decoder 402 and the column selector 403. In various embodiments, the row decoder 402 may be coupled to the write lines (WL), such as write lines 24 discussed above, of the memory structure 20. The memory structure 20 may include any number of WLs 1-N, where N is an integer. The column selector 403 may be coupled to the bit lines (BL), such as bit lines 26 discussed above, of the memory structure 20. The controller 401 may additionally be coupled to the read/write driver 404 and/or the one or more I/O buffers 405. The one or more I/O buffers 405 and read/write driver 404 may be coupled to one another and/or coupled to the column selector 403. The controller 401 may receive various signals from external circuitry related to the circuit 400. The controller 401 may transmit signals to the row decoder 402, column selector 403, and/or read/write driver 404 to cause the row decoder 402, column selector 403, and/or read/write driver 404 to perform operations to change the states of the PCRAM cells 100 and/or sense the states of the PCRAM cells 100.

In various embodiments, the read/write driver 404 may include a current sensing circuit 406 and a voltage sensing circuit 407. In various embodiments, the read/write driver 404, and/or the current sensing circuit 406 specifically, may be configured to apply a selected read voltage (e.g., $V_{read}$) to a PCRAM cell 100, and the current sensing circuit 406 may be configured to sense the resulting cell current ($I_{cell}$). In various embodiments, the read/write driver 404, and/or the current sensing circuit 406 specifically, may be configured to store the sensed cell current ($I_{cell}$) in the one or more I/O buffers 405. In various embodiments, the read/write driver 404, and/or the voltage sensing circuit 407 specifically, may be configured to apply a selected read current (e.g., Iread) to a PCRAM cell 100, and the current voltage circuit 407 may be configured to sense the resulting cell voltage ($V_{cell}$). In various embodiments, the read/write driver 404, and/or the voltage sensing circuit 407 specifically, may be configured to store the sensed cell voltage ($V_{cell}$) in the one or more I/O buffers 405.

In various embodiments, the one or more I/O buffers 405 may be one or more buffers providing storage for current sensing and/or voltage sensing results of the memory structure 20, such as $I_{cell}$ and $V_{cell}$. Additionally, the one or more I/O buffers 405 may store other values, such as results of computing hybrid sensing states (e.g., Hcell). In various embodiments, the one or more I/O buffers 405 may be configured to output values, such as Hcell, to other circuitry, such as the controller 401 and/or other external circuitry related to the memory circuit 400.

In various embodiments, the one or more I/O buffers 405 may store a hybrid sensing state (e.g., $H_{cell}$) computed based on the sensed $I_{cell}$ and the sensed $V_{cell}$. As one example, the $H_{cell}$ may be computed as the $I_{cell}$ multiplied by the $V_{cell}$ raised to a power corresponding to an index (e.g., $H_{cell}=I_{cell}\times(V_{cell}^{\wedge index})$ where the index is a value from 1 to 10. As another example, the Hcell may be computed as the Icell raised to a power corresponding to a first index multiplied by the Vcell raised to a power corresponding to a second index (e.g., $H_{cell}=(I_{cell}^{\wedge index-a})\times(V_{cell}^{\wedge index-b})$ where the first index is a value from 1 to 10 and the second index is a value from 1 to 10. As a further example, the $H_{cell}$ may be computed as the $I_{cell}$ raised to a power corresponding to an index multiplied by the $V_{cell}$ (e.g., $H_{cell}=(I_{cell}^{\wedge index})\times V_{cell}$ where the index is a value from 1 to 10. In various embodiments, the hybrid sensing state (e.g., $H_{cell}$) may be correlated (e.g., in a look-up table, etc.) with resistance state indications for a PCRAM cell 100. In various embodiments, an index (e.g., "index", "index-a", "index-b", etc.) may be a value related to the resistance of the PCRAM cell 100. For example, low resistance levels (e.g., 10 kiloohms (Kohm)) may be associated with low index values (e.g., index values of 1~2) and high resistance levels (e.g., 1 megaohm (Mohm)) may be associated with high index values (e.g., index values of 8~10). Index values may be determined experimentally or may be empirical values. A single index (e.g., "index") or multiple indexes (e.g., "index-a", "index-b", etc.) may be used in the computation of the hybrid sensing state (e.g., $H_{cell}$) depending on the number of MLC states of the PCRAM cell 100. In various embodiments, as the hybrid sensing state (e.g., $H_{cell}$) may not substantially vary (e.g., may be approximately constant) over time (e.g., the hybrid sensing state (e.g., $H_{cell}$) may vary less than 0.1E-6 over a period of 1000 seconds, such as vary less than 0.6E-7 over a period of 1000 seconds, vary 0.5E-7 over a period of 1000 seconds, etc.), the hybrid sensing state (e.g., $H_{cell}$) may be approximately constant despite PCRAM cell 100 resistance drift. In various embodiments, the hybrid sensing state (e.g., $H_{cell}$) correlated (e.g., in a look-up table, etc.) with resistance state indications for the PCRAM cell 100 may enable the determined hybrid sensing state (e.g., $H_{cell}$) to be used to determine the actual resistance state of the PCRAM cell 100 at any time regardless as to the amount of resistance drift that may have occurred in the PCRAM cell 100. As the hybrid sensing state (e.g., $H_{cell}$) may not substantially vary (e.g., may be approximately constant) over time (e.g., the hybrid sensing state (e.g., $H_{cell}$) may vary less than 0.1E-6 over a period of 1000 seconds, such as vary less than 0.6E-7 over a period of 1000 seconds, vary 0.5E-7 over a period of 1000 seconds, etc.), the hybrid sensing state (e.g., $H_{cell}$) may be a stable sensing window over time that may enable MLC applications in the PCRAM cell 100.

Figure 5A:
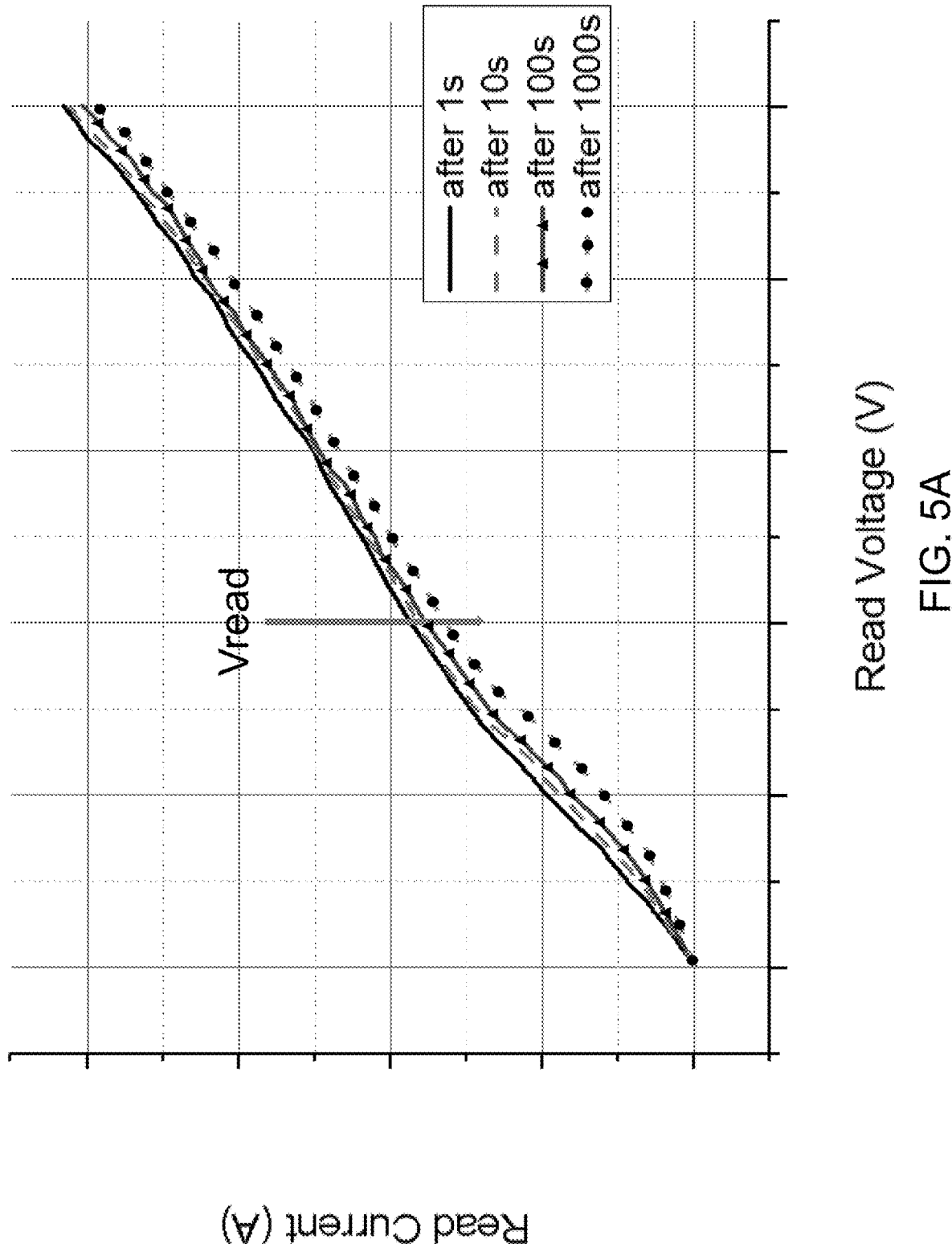
FIG. 5A is a graph relating read currents to read voltages at various times and illustrating the downward current shift experienced at a constant read voltage over time of a PCRAM structure.
Figure 5B:
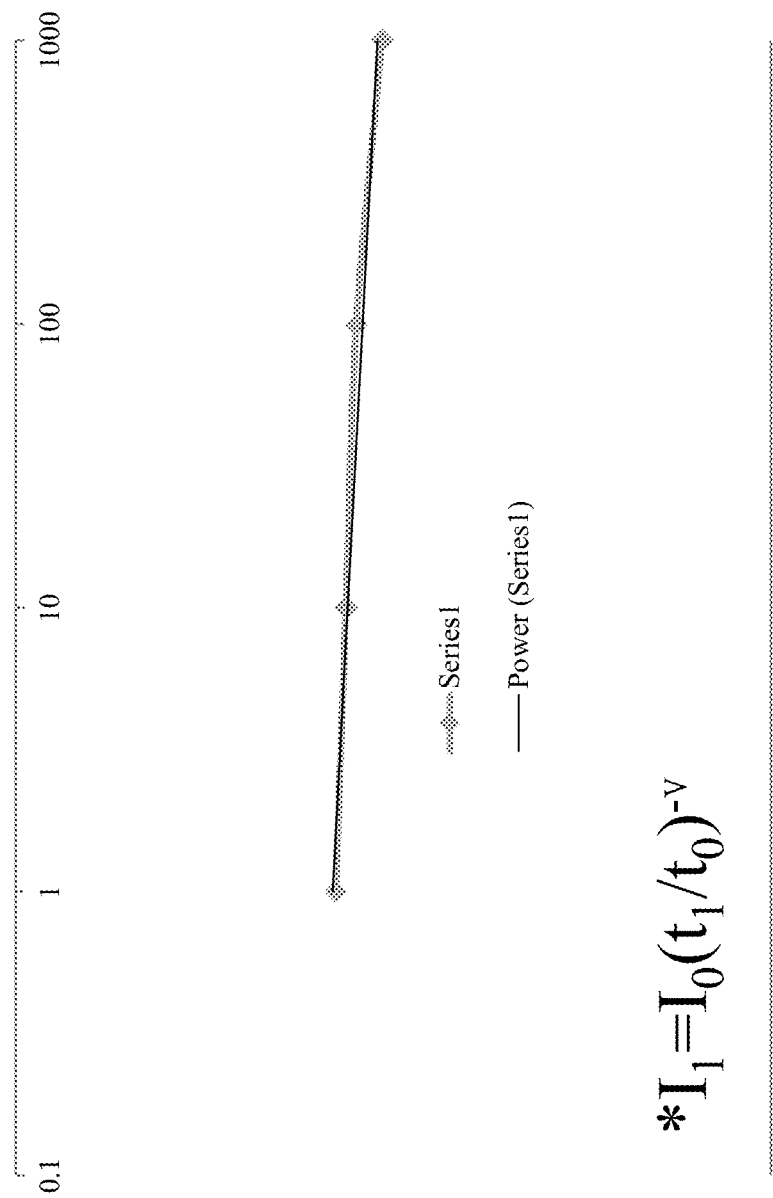
FIG. 5B is a graph showing current observations at various times of the PCRAM structure.

FIG. 5A is a graph relating read currents ($I_{read}$) in Amps (A) to read voltages ($V_{read}$) in volts (V) at various times, such as after 1 second, after 10 seconds, after 100 seconds, and after 1000 seconds, for an example PCRAM cell 100. FIG. 5B is a graph showing current observations ($I_{cell}$) at various times of the PCRAM structure based on the read voltage ($V_{read}$) applied according to the graph in FIG. 5A. With reference to FIGS. 1-5B, FIG. 5A illustrates that the current of the PCRAM cell ($I_{cell}$) sensed at the different times, such as after 1 second, after 10 seconds, after 100 seconds, and after 1000 seconds illustrating the downward current shift experienced at a selected read voltage ($V_{read}$)).

Figure 6A:
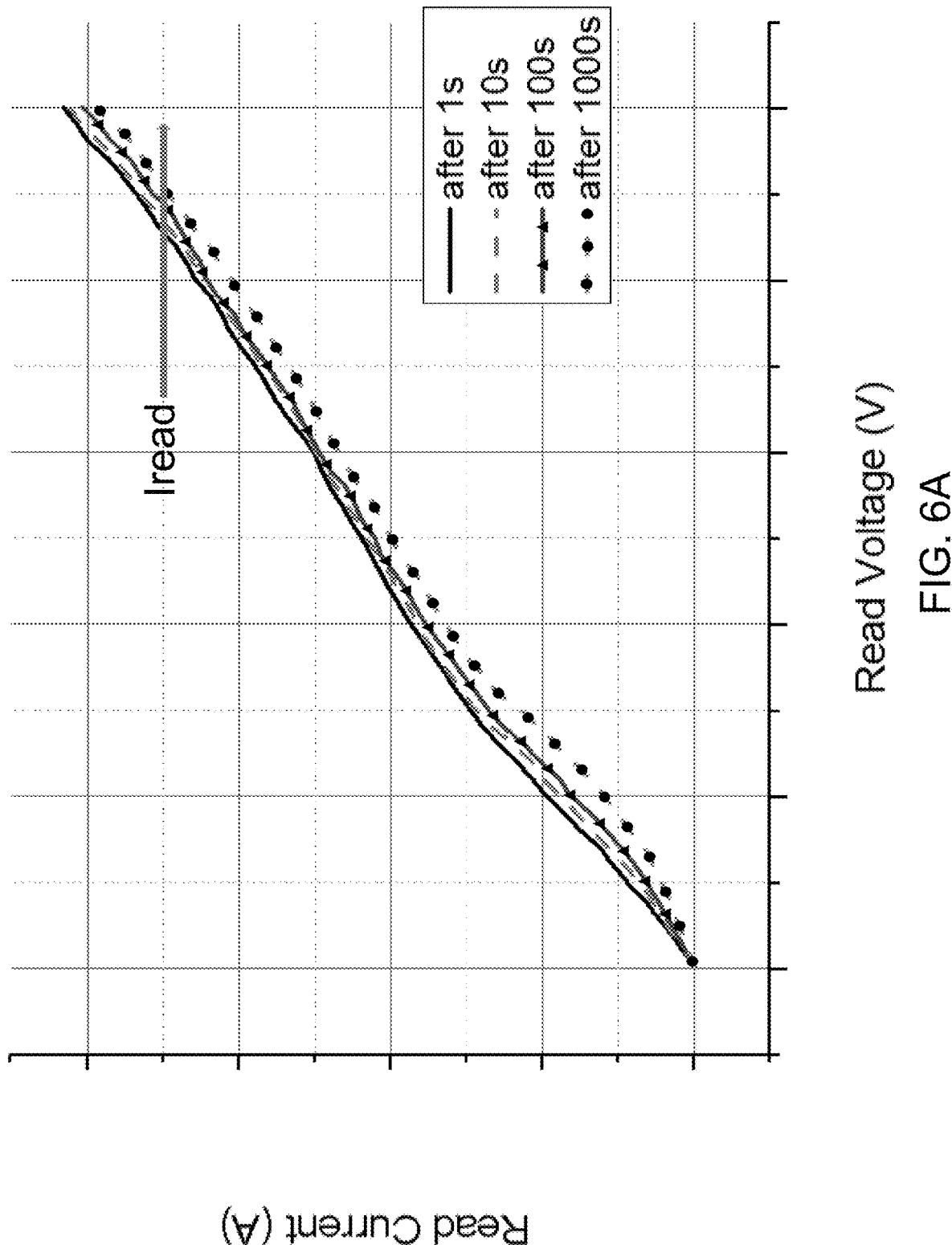
FIG. 6A is a graph relating read currents to read voltages at various times and illustrating the upward voltage shift experienced at a constant read current over time of the PCRAM structure.
Figure 6B:
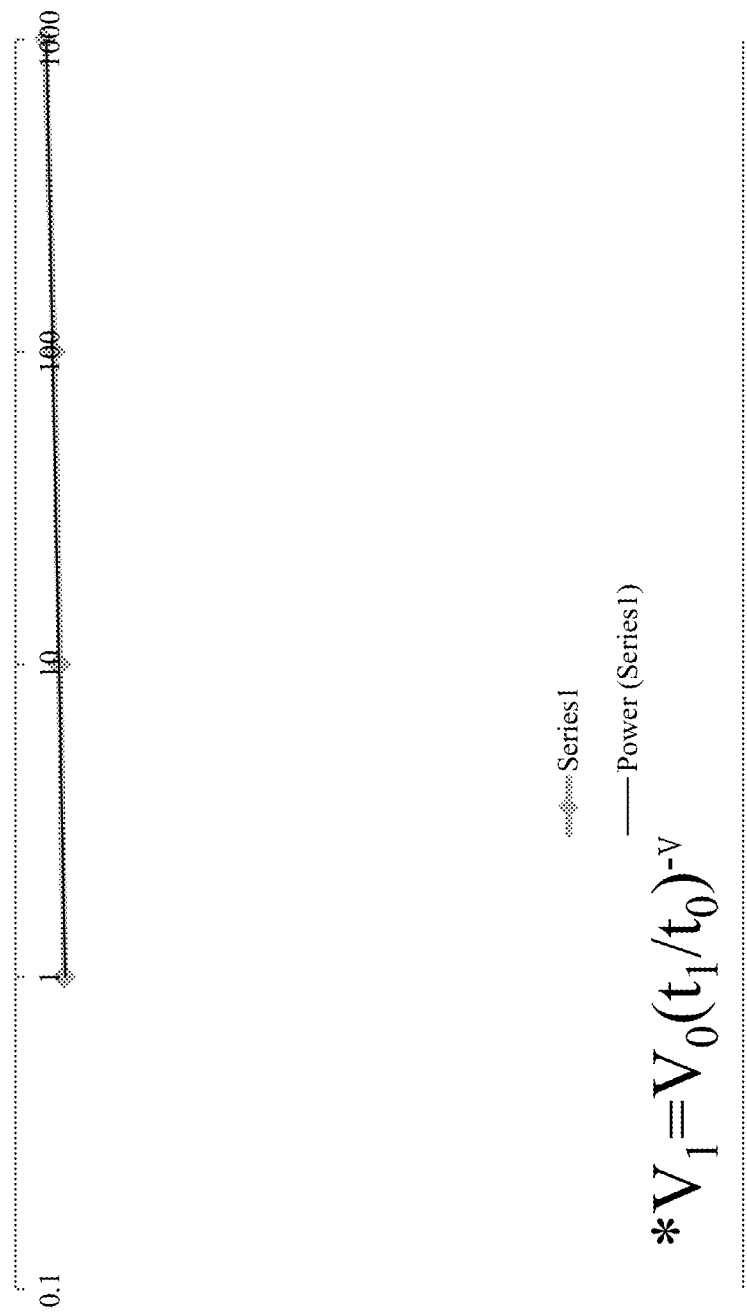
FIG. 6B is a graph showing voltage observations at various times of the PCRAM structure.

FIG. 6A is a graph relating read currents in Amps (A) to read voltages in volts (V) at various times, such as after 1 second, after 10 seconds, after 100 seconds, and after 1000 seconds, for an example PCRAM cell. FIG. 6B is a graph showing voltage observations ($V_{cell}$) at various times of the PCRAM structure based on the read current ($I_{read}$) applied according to the graph in FIG. 6A. With reference to FIGS. 1-6B, FIG. 6A illustrates that the voltage of the PCRAM cell ($V_{cell}$) sensed at the different times, such as after 1 second, after 10 seconds, after 100 seconds, and after 1000 seconds illustrating the upward voltage shift experienced at a selected read current ($I_{read}$).

Figure 7A:
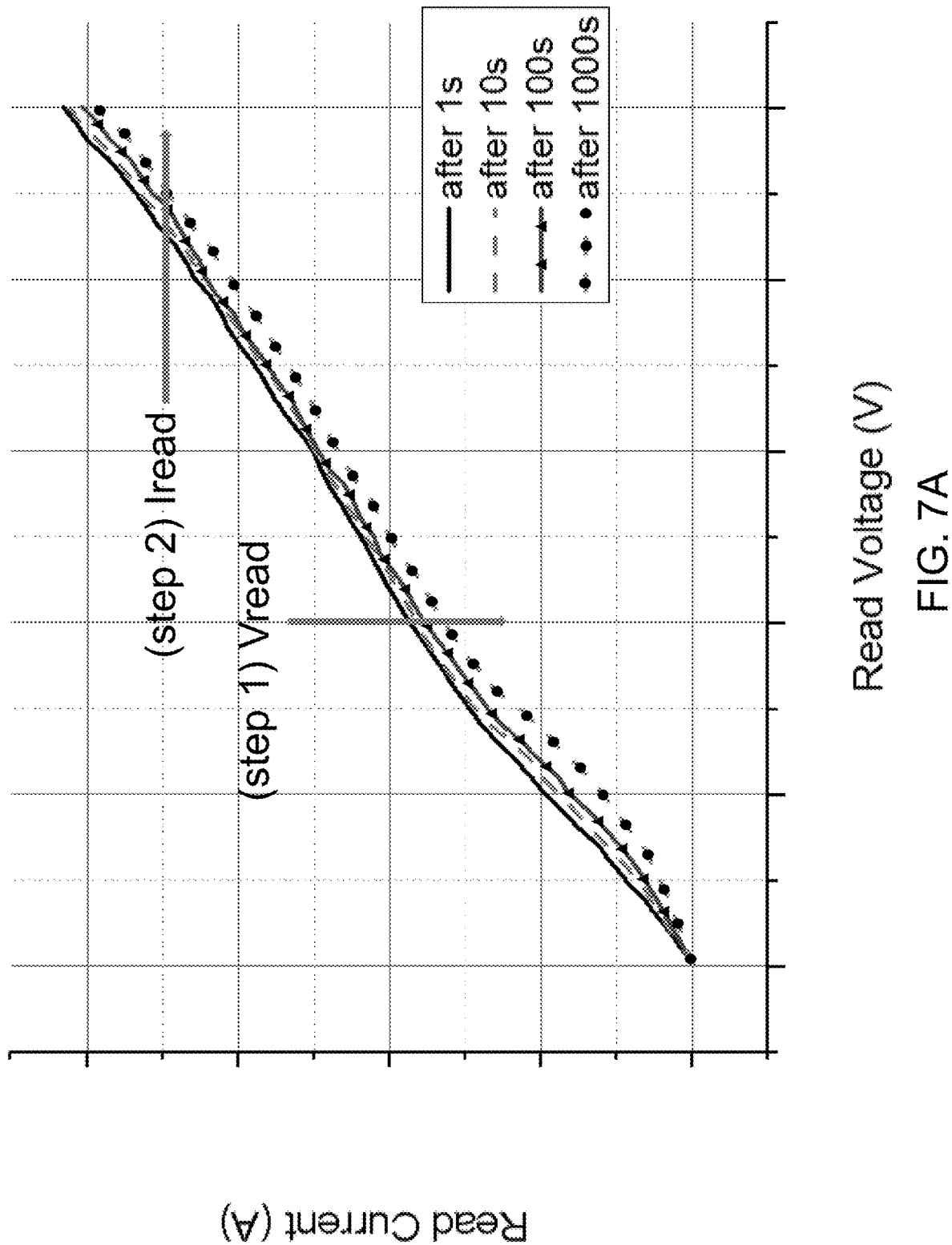
FIG. 7A is a graph relating read currents to read voltages at various times and illustrating the downward current shift experienced at a constant read voltage over time and the upward voltage shift experienced at a constant read current over time of a PCRAM structure.
Figure 7B:
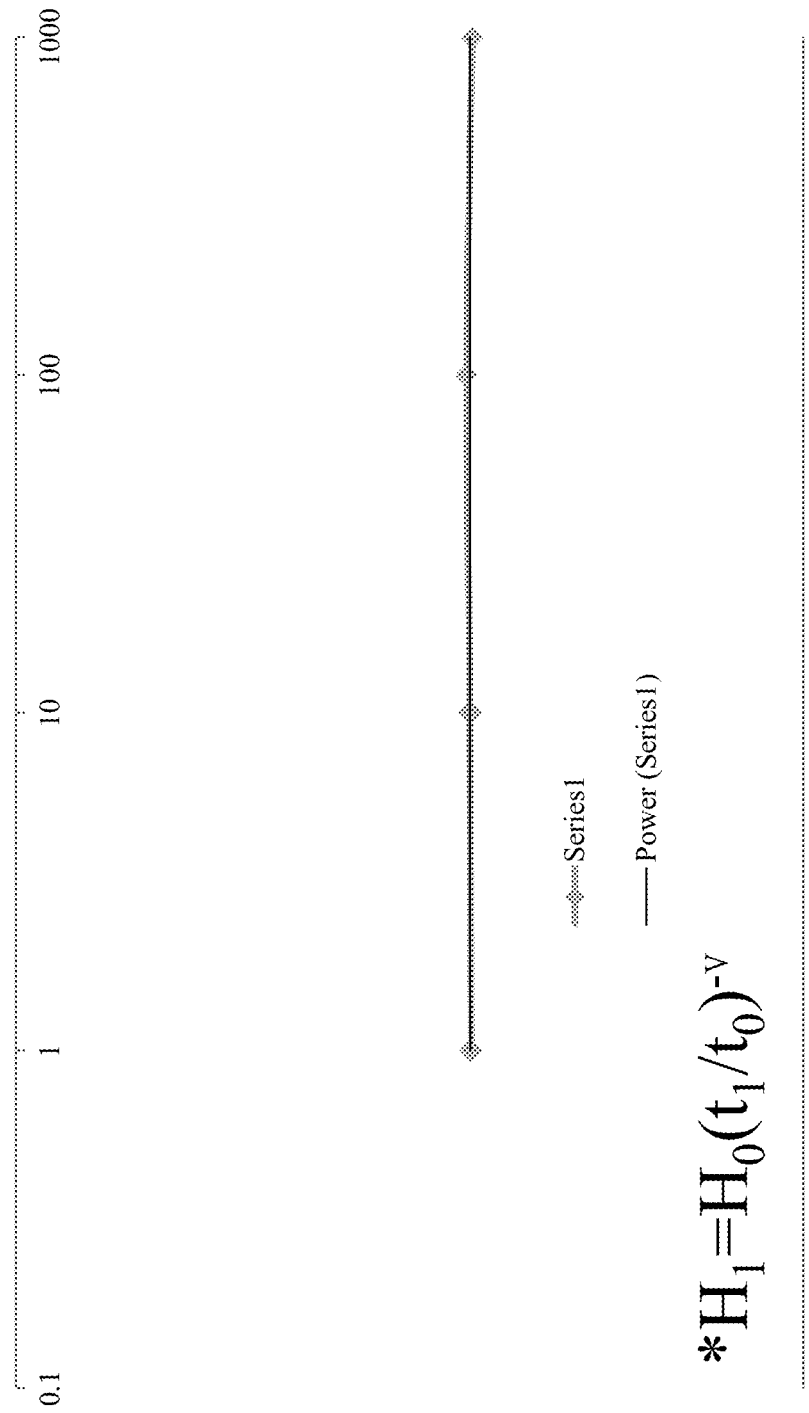
FIG. 7B is a graph showing hybrid current and voltage observations at various times according to various embodiments of the present disclosure of the PCRAM structure.

FIG. 7A is a graph relating read currents in Amps (A) to read voltages in volts (V) at various times, such as after 1 second, after 10 seconds, after 100 seconds, and after 1000 seconds, for an example PCRAM cell. FIG. 7A shows the $V_{read}$ applied in a first step and $I_{read}$ applied in a second step. FIG. 7B is a graph showing hybrid observations ($H_{cell}$) at various times of the PCRAM structure based on the read voltage ($V_{read}$) applied in a first step followed by the read current ($I_{read}$) applied in a second step according to the graph in FIG. 7A. With reference to FIGS. 1-7B, in FIG. 7B the $H_{cell}$ values are shown based on computing the $H_{cell}$ as the result of the $I_{cell}$ multiplied by the Vcell raised to a power corresponding to an index (i.e., $I_{cell} \times V_{cell}^{index}$).

Figure 8:
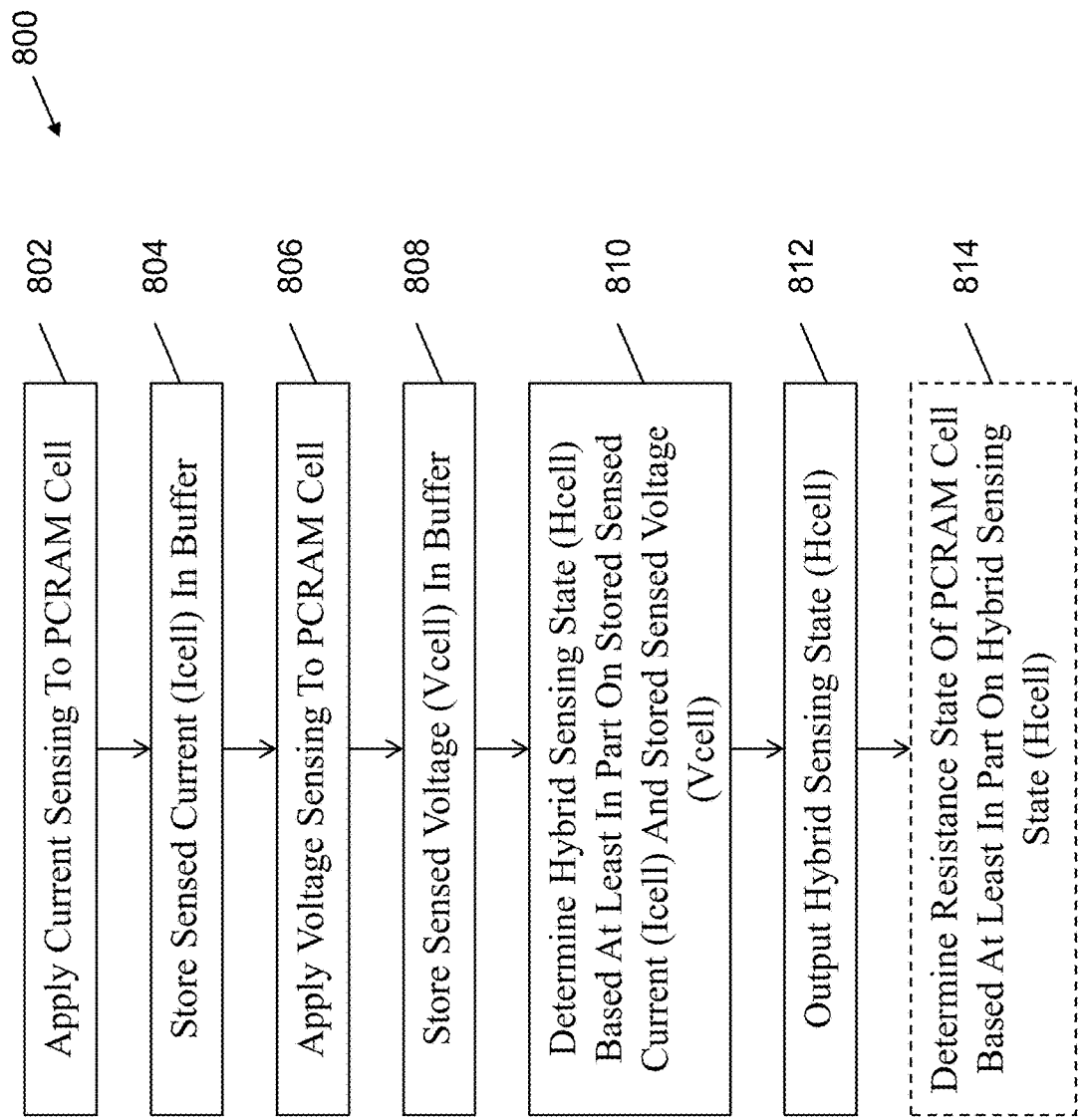
FIG. 8 is a process flow diagram illustrating a method that may be a hybrid sensing scheme that may compensate for cell resistance instability of a PCRAM structure, according to various embodiments of the present disclosure.

FIG. 8 is a process flow diagram illustrating a method 800 that may be a hybrid sensing scheme that may compensate for cell resistance instability of a PCRAM structure, such as PCRAM structure 10. In various embodiments, the operations of method 800 may be performed by a memory circuit, such as memory circuit 400, including a PCRAM structure, such as PCRAM structure 10.

In block 802, the memory circuit 400 may apply current sensing to a PCRAM cell 100. For example, the memory circuit 400 may control a current sensing circuit (e.g., current sensing circuit 406) to sense the current of the PCRAM cell ($I_{cell}$) when a selected read voltage ($V_{read}$) is applied to the PCRAM cell 10.

In block 804, the memory circuit 400 may store the sensed current ($I_{cell}$) in a buffer, such as I/O buffer 405.

In block 806, the memory circuit 400 may apply voltage sensing to the PCRAM cell 100. For example, the memory circuit 400 may control a voltage sensing circuit (e.g., voltage sensing circuit 407) to sense the voltage of the PCRAM cell ($V_{cell}$) when a selected read current ($I_{read}$) is applied to the PCRAM cell 100.

In block 808, the memory circuit 400 may store the sensed voltage ($V_{cell}$) in a buffer, such as I/O buffer 405. In some embodiments, the $I_{cell}$ and $V_{cell}$ may be stored in the same I/O buffer 405. In some embodiments, the $I_{cell}$ and $V_{cell}$ may be stored in different I/O buffers 405. While current sensing and storage operations 802, 804 are illustrated in FIG. 8 as occurring before voltage sensing and storage operations 806, 808, one of skill in the art would understand that the order of voltage and current sensing operations may be swapped in various embodiments. For example, the operations of blocks 806 and 808 may be performed prior to the operations of blocks 802 and 804 such that voltage sensing may occur prior to current sensing.

In block 810, the memory circuit 400 may determine a hybrid sensing state ($H_{cell}$) based at least in part on the stored sensed current ($I_{cell}$) and stored sensed voltage ($V_{cell}$). The memory circuit 400 may determine the hybrid sensing state ($H_{cell}$) by computing the $H_{cell}$ based on the $I_{cell}$ and $V_{cell}$ determined and stored in operations 802-808. As one example, the $Hc_{ell}$ may be computed as the $I_{cell}$ multiplied by the $V_{cell}$ raised to a power corresponding to an index (e.g., $H_{cell} = I_{cell} \times (V_{cell}^{index})$) where the index is a value from 1 to 10. As another example, the $H_{cell}$ may be computed as the $I_{cell}$ raised to a power corresponding to a first index multi-plied by the $V_{cell}$ raised to a power corresponding to a second index (e.g., $H_{cell} = (I_{cell}^{index-a}) \times (V_{cell}^{index-b})$) where the first index is a value from 1 to 10 and the second index is a value from 1 to 10. As a further example, the $H_{cell}$ may be computed as the $I_{cell}$ raised to a power corresponding to an index multiplied by the $V_{cell}$ (e.g., $H_{cell} = (I_{cell}^{index}) \times V_{cell}$) where the index is a value from 1 to 10.

In block 812, the memory circuit 400 may output the hybrid sensing state ($H_{cell}$). For example, the computed $H_{cell}$ may be stored in a buffer, such as I/O buffer 405, may be output to a controller of the memory circuit (e.g., controller 401), and/or may be sent from the memory circuit 400 to another circuit in communication with the memory circuit 400 as part of the operations to output the $H_{cell}$.

In optional block 814, the memory circuit 400 may determine the resistance state of the PCRAM cell based at least in part on the hybrid sensing state ($H_{cell}$). In various embodiments, the hybrid sensing state (e.g., $H_{cell}$) may be correlated (e.g., in a look-up table, etc.) with resistance state indications for the PCRAM structure 10 thereby enabling the determined hybrid sensing state (e.g., $H_{cell}$) to be used to determine the actual resistance state of a PCRAM cell 100. Block 814 may be optional, as in some embodiments, the $H_{cell}$ value itself may be used to indicate the state of the PCRAM cell 100. In various embodiments $H_{cell}$ value and/or the determine actual resistance state of the PCRAM cell 100 may be used to support MLC application by the PCRAM cell 100.

Due to the structural relaxation in the amorphous state of a PCRAM, the resistance exhibited by a PCRAM cell may increase over time. While the resistance may drift up over time, the current sensed through the PCRAM cell may drift down over time due to the structural relaxation in an amorphous state. As a result of this resistance/current/voltage drift, it may be a challenge to store data in a PCRAM cell of MLC levels due to the sensing window degrading over time. Conventional current sensing (under a fixed $V_{read}$) or voltage sensing (under a fixed $I_{read}$) cannot resolve the issues due to resistance/current drift. By implementing a hybrid sensing scheme ($H_{cell}$), the various embodiments disclosed herein may combine both current sensing (under a fixed $V_{read}$) and voltage sensing (under a fixed $I_{read}$) to minimize the issues due to resistance/current drift. Utilizing a hybrid sensing scheme ($H_{cell}$) that utilizes both a sensed current that may drift down over time and sensed voltage that may drift up over time in a calculation, the impact due to the resistance/current drift may be minimized.

Various embodiments provide a hybrid sensing scheme that may compensate for cell resistance instability in semi-conductor devices, such as multi-level cell (MLC) type phase-change random-access memory (PCRAM) structures. Various embodiments may achieve a stable resistance state supporting MLC applications in PCRAM cells.

Various embodiments may provide a method for sensing a resistance state of a phase-change random-access memory (PCRAM) cell 100 including applying current sensing to the PCRAM cell 100 to measure a cell current ($I_{cell}$), applying voltage sensing to the PCRAM cell 100 to measure a cell voltage ($V_{cell}$), determining a hybrid sensing state of the PCRAM cell 100 based at least in part on the cell current ($I_{cell}$) and cell voltage ($V_{cell}$), and outputting the hybrid sensing state ($H_{cell}$). In some embodiments, the method may further include determining a resistance state of the PCRAM cell 100 based at least in part on the hybrid sensing state ($H_{cell}$). In some embodiments, determining the hybrid sensing state ($H_{cell}$) of the PCRAM cell 100 based at least in part on the cell current ($I_{cell}$) and cell voltage ($V_{cell}$) may include computing the hybrid sensing state ($H_{cell}$) as the cell current ($I_{cell}$) multiplied by the cell voltage ($V_{cell}$) raised to a power corresponding to an index, wherein the index is a value from 1 to 10. In various embodiments, an index (e.g., "index", "index-a", "index-b", etc.) may be a value related to the resistance of the PCRAM cell 100. For example, low resistance levels (e.g., 10 kiloohms (Kohm)) may be associated with low index values (e.g., index values of 1~2) and high resistance levels (e.g., 1 megaohm (Mohm)) may be associated with high index values (e.g., index values of 8~10). Index values may be determined experimentally or may be empirical values. A single index (e.g., "index") or multiple indexes (e.g., "index-a", "index-b", etc.) may be used in the computation of the hybrid sensing state (e.g., $H_{cell}$) depending on the number of MLC states of the PCRAM cell 100. In some embodiments, determining the hybrid sensing state of the PCRAM cell 100 based at least in part on the cell current ($I_{cell}$) and cell voltage ($V_{cell}$) may include computing the hybrid sensing state ($H_{cell}$) as the cell current ($I_{cell}$) raised to a power corresponding to a first index multiplied by the cell voltage ($V_{cell}$) raised to a power corresponding to a second index, wherein the first index is a value from 1 to 10 and the second index is a value from 1 to 10. In some embodiments, determining the hybrid sensing state ($H_{cell}$) of the PCRAM cell 100 based at least in part on the cell current ($I_{cell}$) and cell voltage ($V_{cell}$) may include may include computing the hybrid sensing state ($H_{cell}$) as the cell current ($I_{cell}$) raised to a power corresponding to an index multiplied by the cell voltage ($V_{cell}$), wherein the index is a value from 1 to 10.

Various embodiments may include a memory device (400) including a phase-change random-access memory (PCRAM) cell (100), a voltage sensing circuit (407), a current sensing circuit (406), and a controller (401) configured to control the current sensing circuit (406) to measure a cell current of the PCRAM cell (100), control the voltage sensing circuit (407) to measure a cell voltage of the PCRAM cell (100), determine a hybrid sensing state ($H_{cell}$) of the PCRAM cell (100) based at least in part on the cell current ($I_{cell}$) and cell voltage ($V_{cell}$), and output the hybrid sensing state. In some embodiments, the controller (401) may be further configured to determine a resistance state of the PCRAM cell (100) based at least in part on the hybrid sensing state ($H_{cell}$). In some embodiments, the controller (401) may be further configured to determine the hybrid sensing state ($H_{cell}$) of the PCRAM cell (100) based at least in part on the cell current ($I_{cell}$) and cell voltage ($V_{cell}$) by computing the hybrid sensing state ($H_{cell}$) as the cell current ($I_{cell}$) multiplied by the cell voltage ($V_{cell}$) raised to a power corresponding to an index, wherein the index is a value from 1 to 10. In some embodiments, the controller (401) may be further configured to determine the hybrid sensing state ($H_{cell}$) of the PCRAM cell (100) based at least in part on the cell current ($I_{cell}$) and cell voltage ($V_{cell}$) by computing the hybrid sensing state ($H_{cell}$) as the cell current ($I_{cell}$) raised to a power corresponding to a first index multiplied by the cell voltage ($V_{cell}$) raised to a power corresponding to a second index, wherein the first index is a value from 1 to 10 and the second index is a value from 1 to 10. In some embodiments, the controller (401) may be further configured to determine the hybrid sensing state ($H_{cell}$) of the PCRAM cell (100) based at least in part on the cell current ($I_{cell}$) and cell voltage ($V_{cell}$) by computing the hybrid sensing state ($H_{cell}$) as the cell current ($I_{cell}$) raised to a power corresponding to an index multiplied by the cell voltage ($V_{cell}$), wherein the index is a value from 1 to 10.

Various embodiments may provide a method for sensing a resistance state of a phase-change random-access memory (PCRAM) cell 100 including applying current sensing to the PCRAM cell 100 to measure a cell current ($I_{cell}$), applying voltage sensing to the PCRAM cell 100 to measure a cell voltage ($V_{cell}$), determining a hybrid sensing state of the PCRAM cell 100 based at least in part on the cell current ($I_{cell}$) and cell voltage ($V_{cell}$), outputting the hybrid sensing state ($H_{cell}$), and determining a resistance state of the PCRAM cell 100 based at least in part on the hybrid sensing state ($H_{cell}$). In some embodiments, determining the hybrid sensing state ($H_{cell}$) of the PCRAM cell 100 based at least in part on the cell current ($I_{cell}$) and cell voltage ($V_{cell}$) may include computing the hybrid sensing state ($H_{cell}$) as the cell current ($I_{cell}$) multiplied by the cell voltage ($V_{cell}$) raised to a power corresponding to an index, wherein the index is a value from 1 to 10. In some embodiments, determining the hybrid sensing state of the PCRAM cell 100 based at least in part on the cell current ($I_{cell}$) and cell voltage ($V_{cell}$) may include computing the hybrid sensing state ($H_{cell}$) as the cell current ($I_{cell}$) raised to a power corresponding to a first index multiplied by the cell voltage ($V_{cell}$) raised to a power corresponding to a second index, wherein the first index is a value from 1 to 10 and the second index is a value from 1 to 10. In some embodiments, determining the hybrid sensing state ($H_{cell}$) of the PCRAM cell 100 based at least in part on the cell current ($I_{cell}$) and cell voltage ($V_{cell}$) may include may include computing the hybrid sensing state ($I_{cell}$) as the cell current ($I_{cell}$) raised to a power corresponding to an index multiplied by the cell voltage ($V_{cell}$), wherein the index is a value from 1 to 10.

Various embodiments may include a memory device (400) including a phase-change random-access memory (PCRAM) cell (100), a voltage sensing circuit (407), a current sensing circuit (406), and a controller (401) configured to control the current sensing circuit (406) to measure a cell current of the PCRAM cell (100), control the voltage sensing circuit (407) to measure a cell voltage of the PCRAM cell (100), determine a hybrid sensing state ($H_{cell}$) of the PCRAM cell (100) based at least in part on the cell current ($I_{cell}$) and cell voltage ($V_{cell}$), output the hybrid sensing state, and determine a resistance state of the PCRAM cell (100) based at least in part on the hybrid sensing state ($H_{cell}$). In some embodiments, the controller (401) may be further configured to determine the hybrid sensing state ($H_{cell}$) of the PCRAM cell (100) based at least in part on the cell current ($I_{cell}$) and cell voltage ($V_{cell}$) by computing the hybrid sensing state ($H_{cell}$) as the cell current ($I_{cell}$) multiplied by the cell voltage ($V_{cell}$) raised to a power corresponding to an index, wherein the index is a value from 1 to 10. In some embodiments, the controller (401) may be further configured to determine the hybrid sensing state ($H_{cell}$) of the PCRAM cell (100) based at least in part on the cell current ($I_{cell}$) and cell voltage ($V_{cell}$) by computing the hybrid sensing state ($H_{cell}$) as the cell current ($I_{cell}$) raised to a power corresponding to a first index multiplied by the cell voltage ($V_{cell}$) raised to a power corresponding to a second index, wherein the first index is a value from 1 to 10 and the second index is a value from 1 to 10. In some embodiments, the controller (401) may be further configured to determine the hybrid sensing state ($H_{cell}$) of the PCRAM cell (100) based at least in part on the cell current ($I_{cell}$) and cell voltage ($V_{cell}$) by computing the hybrid sensing state ($H_{cell}$) as the cell current ($I_{cell}$) raised to a power corresponding to an index multiplied by the cell voltage ($V_{cell}$), wherein the index is a value from 1 to 10.

The foregoing method descriptions and the process flow diagrams are provided merely as illustrative examples and are not intended to require or imply that the operations of various embodiments must be performed in the order presented. As will be appreciated by one of skill in the art the order of operations in the foregoing embodiments may be performed in any order. Words such as "thereafter," "then," "next," etc. are not intended to limit the order of the operations; these words are used to guide the reader through the description of the methods. Further, any reference to claim elements in the singular, for example, using the articles "a," "an," or "the" is not to be construed as limiting the element to the singular.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for sensing a resistance state of a phase-change random-access memory (PCRAM) cell, comprising:
    applying current sensing to the PCRAM cell to measure a cell current ($I_{cell}$);
    applying voltage sensing to the PCRAM cell to measure a cell voltage ($V_{cell}$);
    determining a hybrid sensing state ($H_{cell}$) of the PCRAM cell based at least in part on the cell current ($I_{cell}$) and cell voltage ($V_{cell}$); and
    outputting the hybrid sensing state ($H_{cell}$).

2. The method of claim 1, wherein determining the hybrid sensing state ($H_{cell}$) of the PCRAM cell based at least in part on the cell current ($I_{cell}$) and cell voltage ($V_{cell}$) comprises computing the hybrid sensing state ($H_{cell}$) as the cell current ($I_{cell}$) multiplied by the cell voltage ($V_{cell}$) raised to a power corresponding to an index, wherein the index is a value from 1 to 10.

3. The method of claim 2, wherein the index is based at least in part on a resistance of the PCRAM cell.

4. The method of claim 1, wherein determining the hybrid sensing state ($H_{cell}$) of the PCRAM cell based at least in part on the cell current ($I_{cell}$) and cell voltage ($V_{cell}$) comprises computing the hybrid sensing state ($H_{cell}$) as the cell current ($I_{cell}$) raised to a power corresponding to a first index multiplied by the cell voltage ($V_{cell}$) raised to a power corresponding to a second index, wherein the first index is a value from 1 to 10 and the second index is a value from 1 to 10.

5. The method of claim 4, wherein the first index and the second index are based at least in part on a resistance of the PCRAM cell.

6. The method of claim 1, wherein determining the hybrid sensing state ($H_{cell}$) of the PCRAM cell based at least in part on the cell current ($I_{cell}$) and cell voltage ($V_{cell}$) comprises computing the hybrid sensing state ($H_{cell}$) as the cell current ($I_{cell}$) raised to a power corresponding to an index multiplied by the cell voltage ($V_{cell}$), wherein the index is a value from 1 to 10.

7. The method of claim 6, wherein the index is based at least in part on a resistance of the PCRAM cell.

8. A memory device, comprising:
    a phase-change random-access memory (PCRAM) cell;
    a voltage sensing circuit;
    a current sensing circuit; and
    a controller configured to:
        control the current sensing circuit to measure a cell current ($I_{cell}$) of the PCRAM cell;
        control the voltage sensing circuit to measure a cell voltage ($V_{cell}$) of the PCRAM cell;
        determine a hybrid sensing state ($H_{cell}$) of the PCRAM cell based at least in part on the cell current ($I_{cell}$) and cell voltage ($V_{cell}$); and
        output the hybrid sensing state ($H_{cell}$).

9. The memory device of claim 8, wherein the controller is further configured to determine a resistance state of the PCRAM cell based at least in part on the hybrid sensing state ($H_{cell}$).

10. The memory device of claim 8, wherein the controller is further configured to determine the hybrid sensing state ($H_{cell}$) of the PCRAM cell based at least in part on the cell current ($I_{cell}$) and cell voltage ($V_{cell}$) by computing the hybrid sensing state ($H_{cell}$) as the cell current ($I_{cell}$) multiplied by the cell voltage ($V_{cell}$) raised to a power corresponding to an index, wherein the index is a value from 1 to 10.

11. The memory device of claim 10, wherein the index is based at least in part on a resistance of the PCRAM cell.

12. The memory device of claim 8, wherein the controller is further configured to determine the hybrid sensing state ($H_{cell}$) of the PCRAM cell based at least in part on the cell current ($I_{cell}$) and cell voltage ($V_{cell}$) by computing the hybrid sensing state ($H_{cell}$) as the cell current ($I_{cell}$) raised to a power corresponding to a first index multiplied by the cell voltage ($V_{cell}$) raised to a power corresponding to a second index, wherein the first index is a value from 1 to 10 and the second index is a value from 1 to 10.

13. The memory device of claim 12, wherein the first index and the second index are based at least in part on a resistance of the PCRAM cell.

14. The memory device of claim 8, wherein the controller is further configured to determine the hybrid sensing state ($H_{cell}$) of the PCRAM cell based at least in part on the cell current ($I_{cell}$) and cell voltage ($V_{cell}$) by computing the hybrid sensing state ($H_{cell}$) as the cell current ($I_{cell}$) raised to a power corresponding to an index multiplied by the cell voltage ($V_{cell}$), wherein the index is a value from 1 to 10.

15. The memory device of claim 14, wherein the index is based at least in part on a resistance of the PCRAM cell.

16. A method for sensing a resistance state of a phase-change random-access memory (PCRAM) cell, comprising:
    applying current sensing to the PCRAM cell to measure a cell current ($I_{cell}$);
    applying voltage sensing to the PCRAM cell to measure a cell voltage ($V_{cell}$);
    determining a hybrid sensing state ($H_{cell}$) of the PCRAM cell based at least in part on the cell current ($I_{cell}$) and cell voltage ($V_{cell}$);
    outputting the hybrid sensing state ($H_{cell}$); and
    determining a resistance state of the PCRAM cell based at least in part on the hybrid sensing state ($H_{cell}$).

17. The method of claim 16, wherein determining the hybrid sensing state ($H_{cell}$) of the PCRAM cell based at least in part on the cell current ($I_{cell}$) and cell voltage ($V_{cell}$) comprises computing the hybrid sensing state ($H_{cell}$) as the cell current ($I_{cell}$) multiplied by the cell voltage ($V_{cell}$) raised to a power corresponding to an index, wherein the index is a value from 1 to 10.

18. The method of claim 17, wherein the index is based at least in part on a resistance of the PCRAM cell.

19. The method of claim 16, wherein determining the hybrid sensing state ($H_{cell}$) of the PCRAM cell based at least in part on the cell current ($I_{cell}$) and cell voltage ($V_{cell}$) comprises computing the hybrid sensing state ($H_{cell}$) as the cell current ($I_{cell}$) raised to a power corresponding to a first index multiplied by the cell voltage ($V_{cell}$) raised to a power corresponding to a second index, wherein the first index is a value from 1 to 10 and the second index is a value from 1 to 10.

20. The method of claim 16, wherein determining the hybrid sensing state ($H_{cell}$) of the PCRAM cell based at least in part on the cell current ($I_{cell}$) and cell voltage ($V_{cell}$) comprises computing the hybrid sensing state ($H_{cell}$) as the cell current ($I_{cell}$) raised to a power corresponding to an index multiplied by the cell voltage ($V_{cell}$), wherein the index is a value from 1 to 10.

* * * * *